(12) United States Patent
Yeh et al.

(10) Patent No.: US 11,862,544 B2
(45) Date of Patent: Jan. 2, 2024

(54) ELECTRONIC ASSEMBLY

(71) Applicant: Advanced Semiconductor Engineering, Inc., Kaohsiung (TW)

(72) Inventors: Chang-Lin Yeh, Kaohsiung (TW); Jen-Chieh Kao, Kaohsiung (TW)

(73) Assignee: ADVANCED SEMICONDUCTOR ENGINEERING, INC., Kaohsiung (TW)

(*) Notice: Subject to any disclaimer, the term of this patent is extended or adjusted under 35 U.S.C. 154(b) by 105 days.

(21) Appl. No.: 17/239,482

(22) Filed: Apr. 23, 2021

(65) Prior Publication Data

US 2022/0344246 A1    Oct. 27, 2022

(51) Int. Cl.
   *H01L 23/498*   (2006.01)
   *H01L 25/00*    (2006.01)
   *H01L 23/31*    (2006.01)
   *H01L 25/10*    (2006.01)

(52) U.S. Cl.
   CPC .... *H01L 23/49805* (2013.01); *H01L 23/3121* (2013.01); *H01L 25/105* (2013.01); *H01L 25/50* (2013.01)

(58) Field of Classification Search
   CPC ........... H01L 23/49805; H01L 23/3121; H01L 25/105
   See application file for complete search history.

(56) References Cited

U.S. PATENT DOCUMENTS

| | | | |
|---|---|---|---|
| 7,944,707 B2 | 5/2011 | Hung et al. | |
| 11,056,412 B2* | 7/2021 | Tseng | H01L 21/568 |
| 11,296,051 B2* | 4/2022 | Kao | H01L 24/20 |
| 11,456,240 B2* | 9/2022 | Yu | H01L 24/20 |
| 11,594,469 B2* | 2/2023 | Ku | H01L 24/97 |
| 2020/0066692 A1 | 2/2020 | Wolter et al. | |
| 2020/0118912 A1 | 4/2020 | Ho et al. | |
| 2021/0057572 A1* | 2/2021 | Chen | H01L 25/167 |
| 2021/0202396 A1* | 7/2021 | Wu | H01L 23/5389 |
| 2021/0305228 A1* | 9/2021 | Yang | H01L 23/49816 |
| 2022/0115288 A1* | 4/2022 | Yen | H01L 21/6835 |
| 2022/0336317 A1* | 10/2022 | Yeh | H01L 23/13 |
| 2022/0353619 A1* | 11/2022 | Yeh | H04R 19/02 |
| 2023/0042984 A1* | 2/2023 | Yeh | H05K 5/065 |

FOREIGN PATENT DOCUMENTS

TW    I324821 B    5/2010

* cited by examiner

*Primary Examiner* — Thao P Le
(74) *Attorney, Agent, or Firm* — FOLEY & LARDNER LLP

(57) ABSTRACT

The present disclosure provides an electronic assembly including a semiconductor device package. The semiconductor device package includes a first package and a conductive element. The first package includes an electronic component and a protection layer covering the electronic component. The conductive element is supported by the protection layer and electrically connected with the electronic component through an electrical contact. A method for manufacturing a semiconductor device package is also provided in the present disclosure.

18 Claims, 19 Drawing Sheets

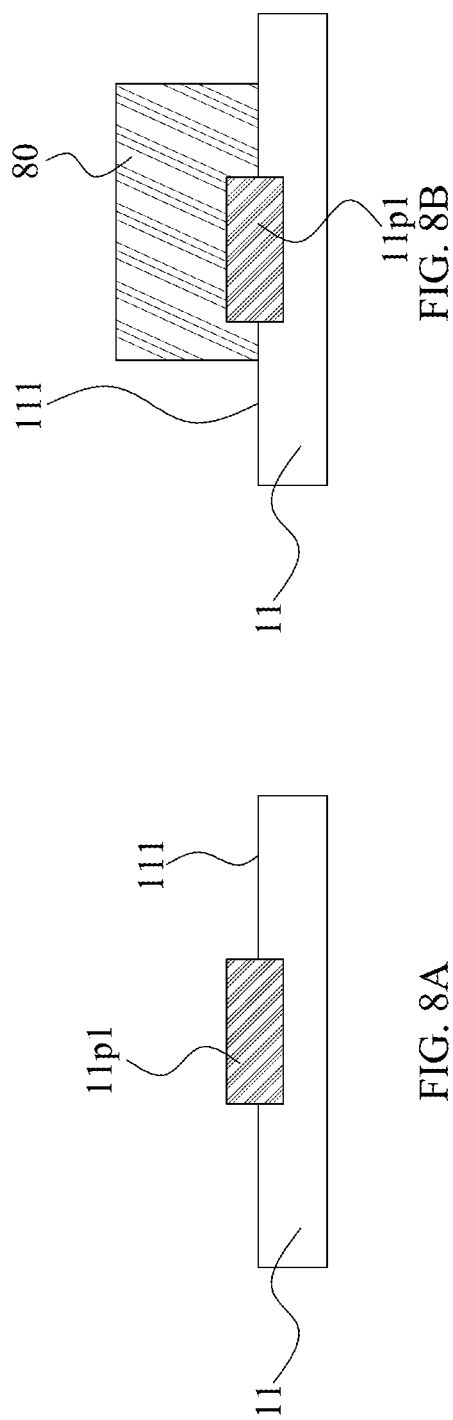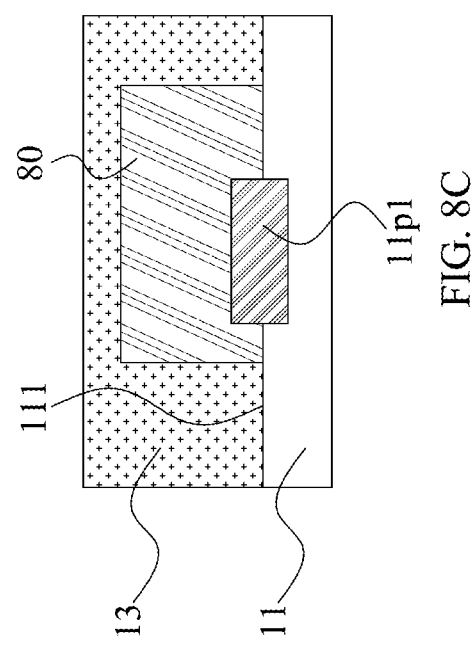

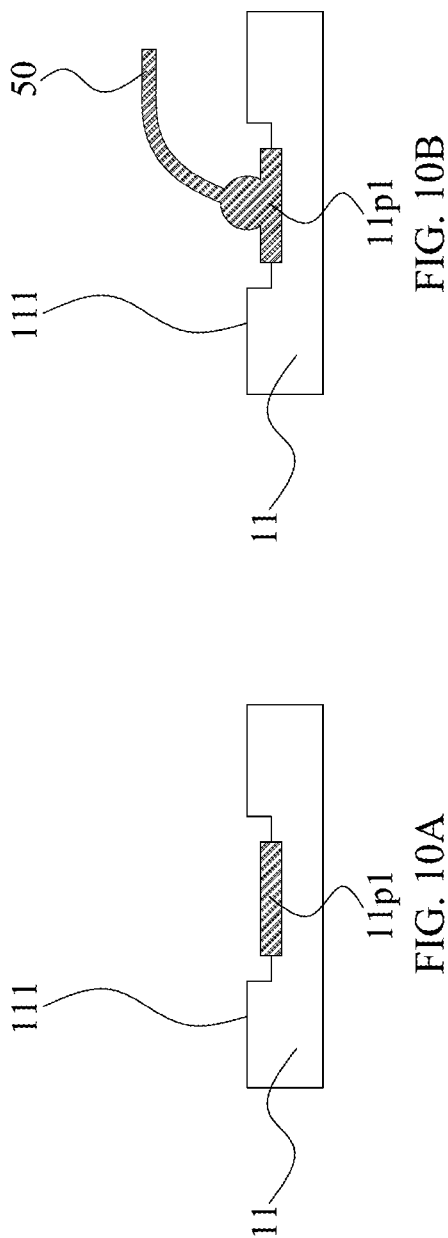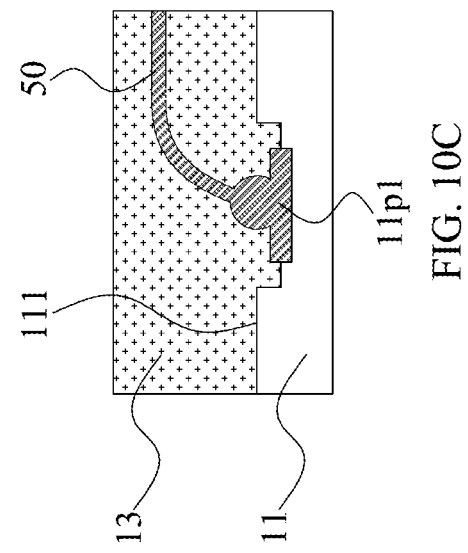

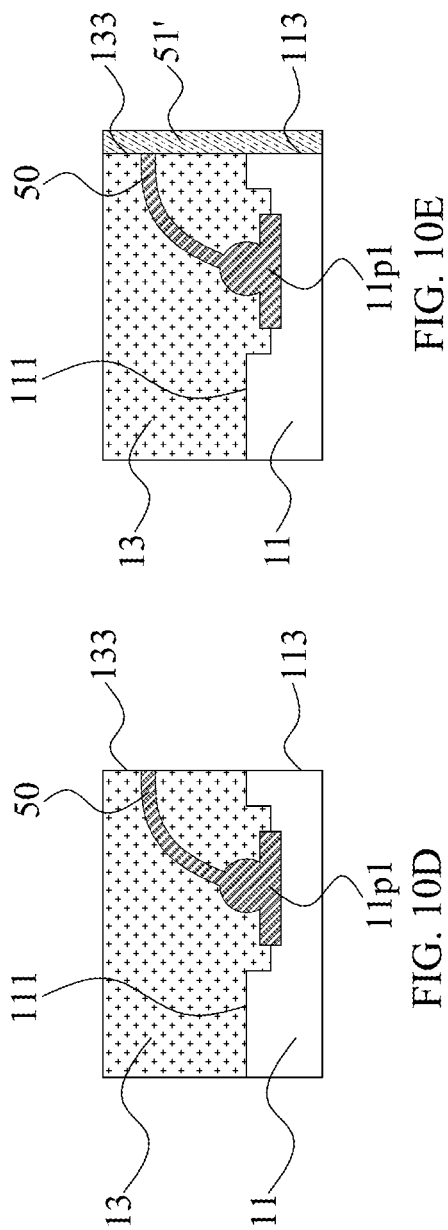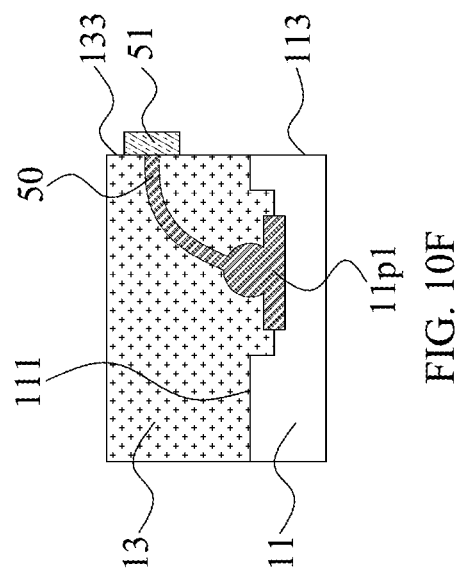

ELECTRONIC ASSEMBLY

BACKGROUND

1. Technical Field

The present disclosure generally relates to an electronic assembly having a conductive element.

2. Description of the Related Art

Flexible Printed Circuits (FPC) or flexible foils can be used to connect two structures (such as substrates or packages) and provide electrical interconnection or signal transmission in two directions or bending directions. Hot bar reflow soldering (or hot bar bonding) can be used to bond the FPC to the substrates. However, joint areas are required on the substrates, which may increase the package size. In addition, warpage of the flex-foils should be well-controlled to prevent low yield issues.

SUMMARY

In some embodiments, an electronic assembly includes a first package and a conductive element. The first package includes an electronic component and a protection layer covering the electronic component. The conductive element is supported by the protection layer and electrically connected with the electronic component through an electrical contact.

In some embodiments, an electronic assembly includes a first package including an electronic component and a protection layer covering the electronic component. The protection layer defines a cavity penetrating the protection layer. The electronic assembly further includes a second package pluggable with respect to the cavity of the first package through the protection layer.

In some embodiments, a method for manufacturing a semiconductor device package includes providing a first package including a first substrate, a first electronic component disposed on the substrate, and a first protection layer covering the first electronic component. The first protection layer defines a cavity penetrating the first protection layer. The method also includes providing a second package including a second substrate, a second electronic component disposed on the second substrate and a second protection layer covering the second electronic component. The method also includes plugging the second package with respect to the cavity of the first protection layer of the first package.

BRIEF DESCRIPTION OF THE DRAWINGS

Aspects of the present disclosure are readily understood from the following detailed description when read with the accompanying figures. It should be noted that various features may not be drawn to scale. The dimensions of the various features may be arbitrarily increased or reduced for clarity of discussion.

FIG. 8A, FIG. 8B, FIG. 8C, FIG. 8D, and FIG. 8E illustrate one or more stages of a method of manufacturing an exemplary semiconductor device package in accordance with some embodiments of the present disclosure.

FIG. 10A, FIG. 10B, FIG. 10C, FIG. 10D, FIG. 10E, and FIG. 10F illustrate one or more stages of a method of manufacturing an exemplary semiconductor device package in accordance with some embodiments of the present disclosure.

Common reference numerals are used throughout the drawings and the detailed description to indicate the same or similar elements. The present disclosure will be more apparent from the following detailed description taken in conjunction with the accompanying drawings.

DETAILED DESCRIPTION

Figure 1A:
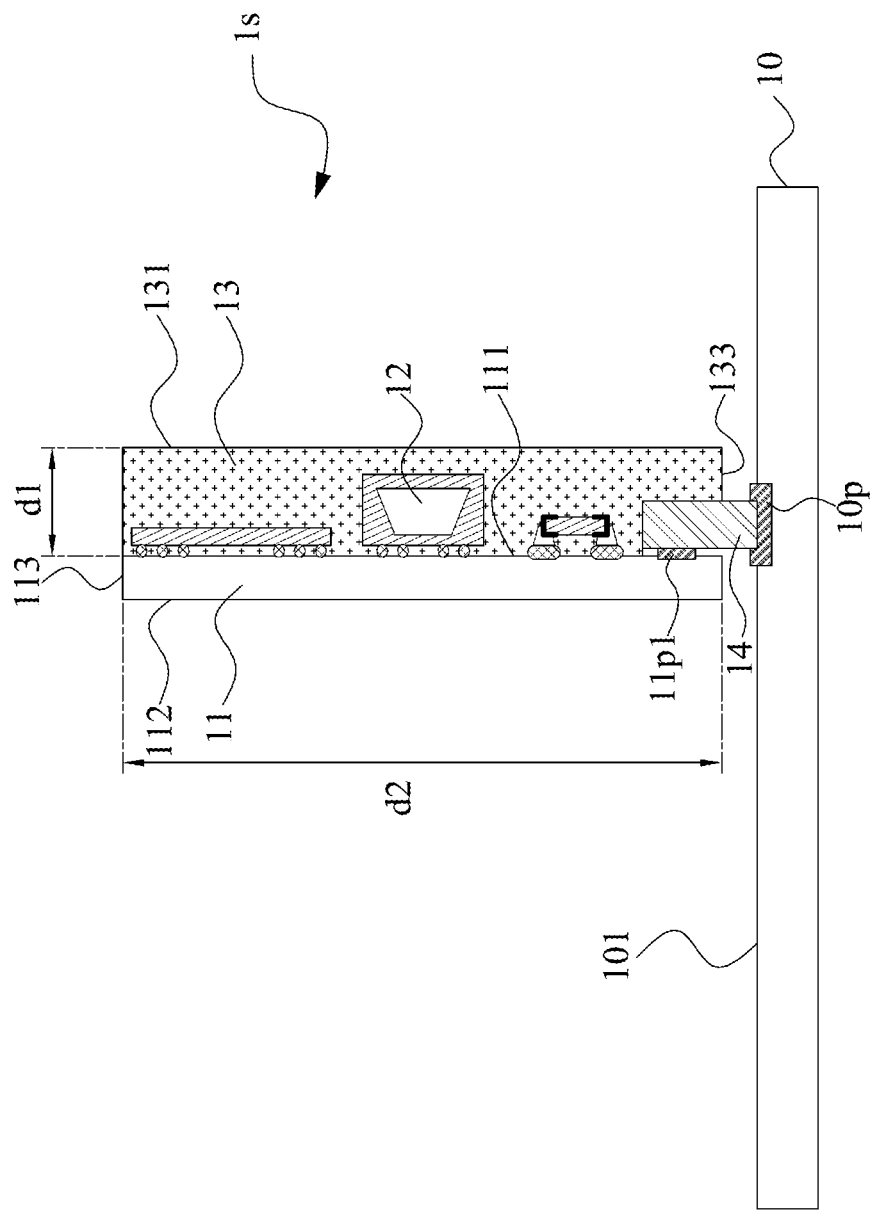
FIG. 1A illustrates a cross sectional view of an exemplary electronic assembly in accordance with some embodiments of the present disclosure.

The following disclosure provides for many different embodiments, or examples, for implementing different features of the provided subject matter. Specific examples of components and arrangements are described below. These are, of course, merely examples and are not intended to be limiting. In the present disclosure, a reference to the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for simplicity and clarity and does not in itself dictate a relationship between the various embodiments and/or configurations discussed.

Embodiments of the present disclosure are discussed in detail below. It should be appreciated, however, that the present disclosure provides many applicable concepts that can be embodied in a wide variety of specific contexts. The specific embodiments discussed are merely illustrative and do not limit the scope of the disclosure.

FIG. 1A illustrates a cross sectional view of an exemplary electronic assembly 1 in accordance with some embodiments of the present disclosure. The electronic assembly 1 may include a substrate 10, a semiconductor device package 1s, and a conductive element 14.

The substrate 10 may include, for example, a printed circuit board (PCB), such as a paper-based copper foil laminate, a composite copper foil laminate, a polymer-impregnated glass-fiber-based copper foil laminate, or so on. In some embodiments, the substrate 10 may include a flexible PCB. The substrate 10 may include one or more interconnection structures, such as a redistribution layer (RDL) or a grounding element. The interconnection structures may include, for example, one or more conductive pads 10p proximate to, adjacent to, or embedded in and exposed from a surface 101 of the substrate 10 facing the semiconductor device package 1s.

The semiconductor device package 1s (which may be abbreviated as a package) may include a substrate 11, an electronic component 12, and an encapsulant 13. The details of the substrate 11 may refer to the substrate 10, and will thus not be repeated hereafter. The substrate 11 may have a surface 111, a surface 112 opposite to the surface 111, and a surface 113 (which can also be referred to as a lateral surface of the substrate 11) extending between the surface 111 and the surface 112. The surface 113 may face the substrate 10.

The substrate 11 may include an electrical contact 11p1 proximate to, adjacent to, or embedded in and exposed from the surface 111 of the substrate 11. In some embodiments, the electrical contact 11p1 may include a conductive pad. In some embodiments, the electrical contact 11p1 may be adjacent to the surface 113 of the substrate 11.

The electronic component 12 may be disposed on the surface 111 of the substrate 11. The electronic component 12 may include, for example, a chip or a die. The chip or die may include a semiconductor substrate (e.g., silicon substrate), one or more integrated circuit (IC) devices, and one or more interconnection structures therein. In some examples, the IC devices may include an active component, such as an IC chip or a die. In some examples, the IC devices may include a passive electronic component, such as a capacitor, a resistor, or an inductor. In some embodiments, the electronic component 12 may be electrically connected to the substrate 11 by, for example, flip-chip or wire-bonding.

The encapsulant 13 (which may be referred to as a protection layer) may be disposed on the surface 111 of the substrate 11. The encapsulant 13 may cover or encapsulate the electronic component 12. The electronic component 12 may be covered or encapsulated in the encapsulant 13. In some embodiments, the encapsulant 13 may include, for example, an epoxy resin having fillers, a molding compound (e.g., an epoxy molding compound or other molding compound), a polyimide, a phenolic compound or material, a material with a silicone dispersed therein, or a combination thereof. The encapsulant 13 may have a surface 131 (which can also be referred to as a top surface of the encapsulant 13) facing away from the substrate 11 and an edge 133 (which can also be referred to as a lateral surface of the encapsulant 13). In some embodiments, the edge 133 may be substantially coplanar with the surface 113 of the substrate 11.

The encapsulant 13 may have a dimension d1 (e.g., a thickness or a height) measured between the surface 111 of the substrate 11 and the surface 131 of the encapsulant 13. The encapsulant 13 may have a dimension d2 (e.g., a length or a width) measured between two edges of the encapsulant 13 from a side view as shown in FIG. 1A. In some embodiments, the dimension d2 may be greater than the dimension d1. In other words, the dimension d1 may be smaller than the dimension d2. The shorter side of the encapsulant 13 may face the substrate 10.

The encapsulant 13 may define or have a cavity or a recessed portion (not annotated in FIG. 1A, such as the cavity 13h1 in FIG. 1B) recessed from the edge 133 of the encapsulant 13. As a result, the cavity may face the surface 101 of the substrate 10. The electrical contact 11p1 may be exposed from the encapsulant 13 through the cavity to provide electrical interconnection or signal transmission between the substrate 10 and the semiconductor device package 1s.

The conductive element 14 may be disposed on the surface 101 of the substrate 10 and electrically connected to the substrate 10 through the conductive pad 10p. The conductive element 14 may be accommodated in (such as partially accommodated in) the cavity. The conductive element 14 may be surrounded by (such as partially accommodated by) the encapsulant 13. The conductive element 14 may be pluggable with respect to the encapsulant 13 through the cavity defined by the encapsulant 13. In other words, the substrate 10 may be pluggable with respect to the encapsulant 13 through the cavity.

In some embodiments, the conductive element 14 may be in contact with (such as in direct contact with) the encapsulant 13. The conductive element 14 may press against the encapsulant 13. The conductive element 14 may have a pressing force on the encapsulant 13. In some embodiments, the conductive element 14 may be in contact with (such as in direct contact with) the electrical contact 11p1 in the cavity. The conductive element 14 may press against the electrical contact 11p1 in the cavity. The conductive element 14 may have a pressing force on the electrical contact 11p1 in the cavity. The conductive element 14 may supported in the cavity. The conductive element 14 may supported by the encapsulant 13. For example, the conductive element 14 may be directly supported by the encapsulant 13. For example, the conductive element 14 may be indirectly supported by the encapsulant 13, such as supported by the electrical contact 11p1.

In some embodiments, the conductive element 14 may include, for example, gold (Au), silver (Ag), copper (Cu), nickel (Ni), palladium (Pd), another metal(s) or alloy(s), or a combination of two or more thereof. In some embodiments, the conductive element 14 may include a conductive pin. For example, the conductive element 14 may extend from the surface 101 of the substrate 10 into the cavity. For example, the conductive element 14 may have an elongation direction, an extending direction, or a longer side in a direction from the surface 101 of the substrate 10 into the cavity. For example, the conductive element 14 may pass through the edge 133 of the encapsulant 13.

The conductive element 14 may provide electrical interconnection or signal transmission between the substrate 10 and the semiconductor device package 1s. For example, the conductive element 14 may be electrically connected between the electrical contact 11p1 and the conductive pad 10p. For example, the conductive element 14 may be electrically connected with the electronic component 12 through the electrical contact 11p1. In some embodiments, the signal transmission path between the electrical contact 11p1 and the conductive pad 10p may be in the extending direction of the conductive element 14. For example, the signal transmission path may extend from the surface 101 of the substrate 10 into the cavity. For example, the signal transmission path may be along a direction substantially perpendicular to the surface 101 of the substrate 10. For example, the signal transmission path may be along a direction substantially in parallel with the surface 111 of the substrate 11.

Figure 1B:
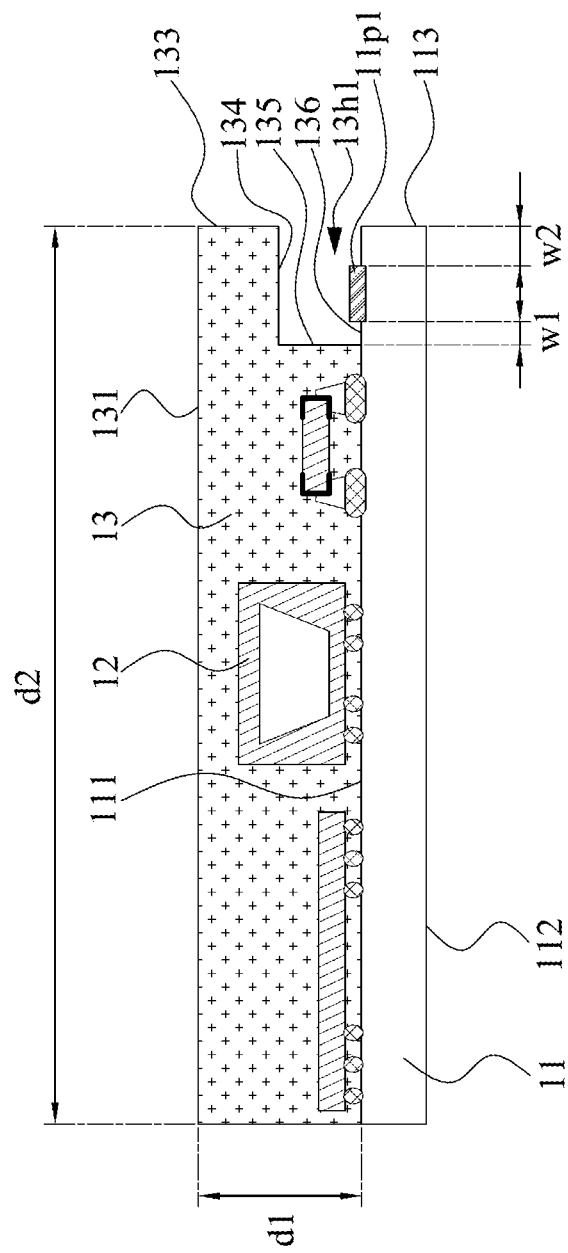
FIG. 1B illustrates a cross sectional view of an exemplary semiconductor device package in accordance with some embodiments of the present disclosure.

FIG. 1B illustrates a cross sectional view of the semiconductor device package 1s in accordance with some embodiments of the present disclosure. The semiconductor device package 1s in FIG. 1B is similar to the semiconductor device package 1s in FIG. 1A, with more details described below.

The cavity 13h1 may be recessed from the short side (with the dimension d1) of the encapsulant 13. The cavity 13h1 may be recessed from the edge 133 of the encapsulant 13 along the surface 101 of the substrate 10. The cavity 13h1 may be not formed on the surface 131 of the encapsulant 13. In other words, the cavity 13h1 may be not recessed from the surface 131 of the encapsulant 13.

In some embodiments, the cavity 13h1 may be spaced apart from the surface 131 of the encapsulant 13. For example, a sidewall 134 of the cavity 13h1 may be opposite to the surface 131 of the encapsulant 13. In some embodiments, the sidewall 134 of the cavity 13h1 may provide a support for the conductive element 14 in FIG. 1A to be able to press against and increase the contact area between the conductive element 14 and the encapsulant 13. Therefore, the conductive element 14 can be secured in the cavity 13h1 by the compression force.

In some embodiments, the cavity 13h1 may have the sidewall 134 defined by the encapsulant 13, an opposite sidewall 136 defined by the surface 111 of the substrate 11, and a bottom surface 135 defined by the encapsulant 13. The bottom surface 135 may be located between the sidewall 134 and the sidewall 136.

In some embodiments, the electrical contact 11p1 may be spaced apart from the encapsulant 13. For example, the electrical contact 11p1 may be spaced apart from the bottom surface 135 of the encapsulant 13 by a distance w1. For example, the electrical contact 11p1 may be not in contact with the encapsulant 13. In some embodiments, the electrical contact 11p1 may be spaced apart from the surface 113 of the substrate 11 by a distance w2. In some embodiments, the distance w1 and the distance w2 may each be greater than zero.

Figure 1D:
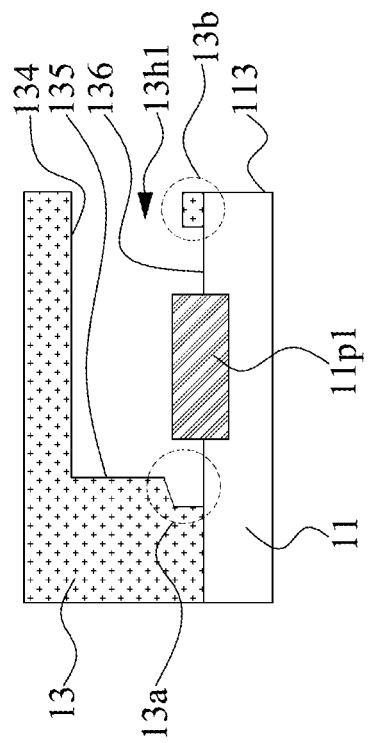
FIG. 1D illustrates a cross sectional view of a part of an exemplary semiconductor device package in accordance with some embodiments of the present disclosure.
Figure 1C:
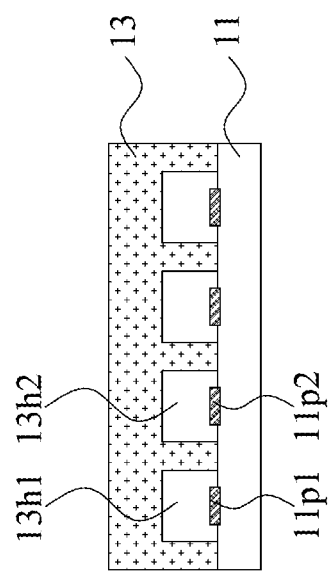
FIG. 1C illustrates a cross sectional view of an exemplary semiconductor device package in accordance with some embodiments of the present disclosure.

FIG. 1C illustrates a cross sectional view of a semiconductor device package in accordance with some embodiments of the present disclosure. In some embodiments, the semiconductor device package is in FIG. 1A and FIG. 1B may have a cross sectional view as shown in FIG. 1C.

The encapsulant 13 may have a plurality of cavities (including the cavity 13h1 and the cavity 13h2). The cavity 13h2 may be spaced apart from the cavity 13h1. An electrical contact 11p2 may be exposed from the encapsulant 13 through the cavity 13h2.

In some embodiments, with more electrical contacts to provide electrical interconnection or signal transmission between the substrate 10 and the semiconductor device package 1s, I/O numbers can be increased and electrical performance of the electronic assembly 1 can be improved.

In some other embodiments, the encapsulant 13 may have any number of cavities. In addition, there may be one or more electrical contacts exposed from each of the cavities.

FIG. 1D illustrates a cross sectional view of a part of an exemplary semiconductor device package in accordance with some embodiments of the present disclosure. FIG. 1D only illustrates a part of the substrate 11, a part of the encapsulant 13, and the electrical contact 11p1. In some embodiments, the semiconductor device package is in FIG. 1A, and FIG. 1B may have a cross sectional view as shown in FIG. 1C.

The bottom surface 135 of the encapsulant 13 may have a hole as illustrated in the dotted circle 13a. For example, the bottom surface 135 of the encapsulant 13 may be non-planar. Residue of the encapsulant 13 as illustrated in the dotted circle 13b may remain on the substrate 11. The residue of the encapsulant 13 may be not connected with the main portion of the encapsulant 13. In some embodiments, the residue of the encapsulant 13 may be adjacent to the surface 113 of the substrate 11. In some embodiments, the residue of the encapsulant 13 may have a surface substantially coplanar with the surface 113 of the substrate 11.

In some embodiments, the electrical interconnection or signal transmission in two directions or bending directions may be obtained by bonding a connector (such as an FPC or a flexible foil) to the conductive pads on the substrates 10 and 11 through soldering. Joint areas for placing the soldering materials may be required on the substrates 10 and 11, which may increase the package size. In addition, warpage of the FPC should be well-controlled to prevent low yield issues.

As shown in FIG. 1A and FIG. 1B, by providing the cavity 13h1, which is recessed from the edge 133 of the encapsulant 13 for accommodating the conductive element 14, electrical interconnection or signal transmission between the substrate 10 and the semiconductor device package 1s can be obtained through the conductive element 14. Since no joint area is required to solder the conductive element 14, the layout design flexibility can be increased, and more electronic components can be incorporated into the package. In addition, warpage issues that may be caused by the FPC may be alleviated or eliminated, which would in turn improve the electrical performance and reliability of the electronic assembly 1.

Figure 2A:
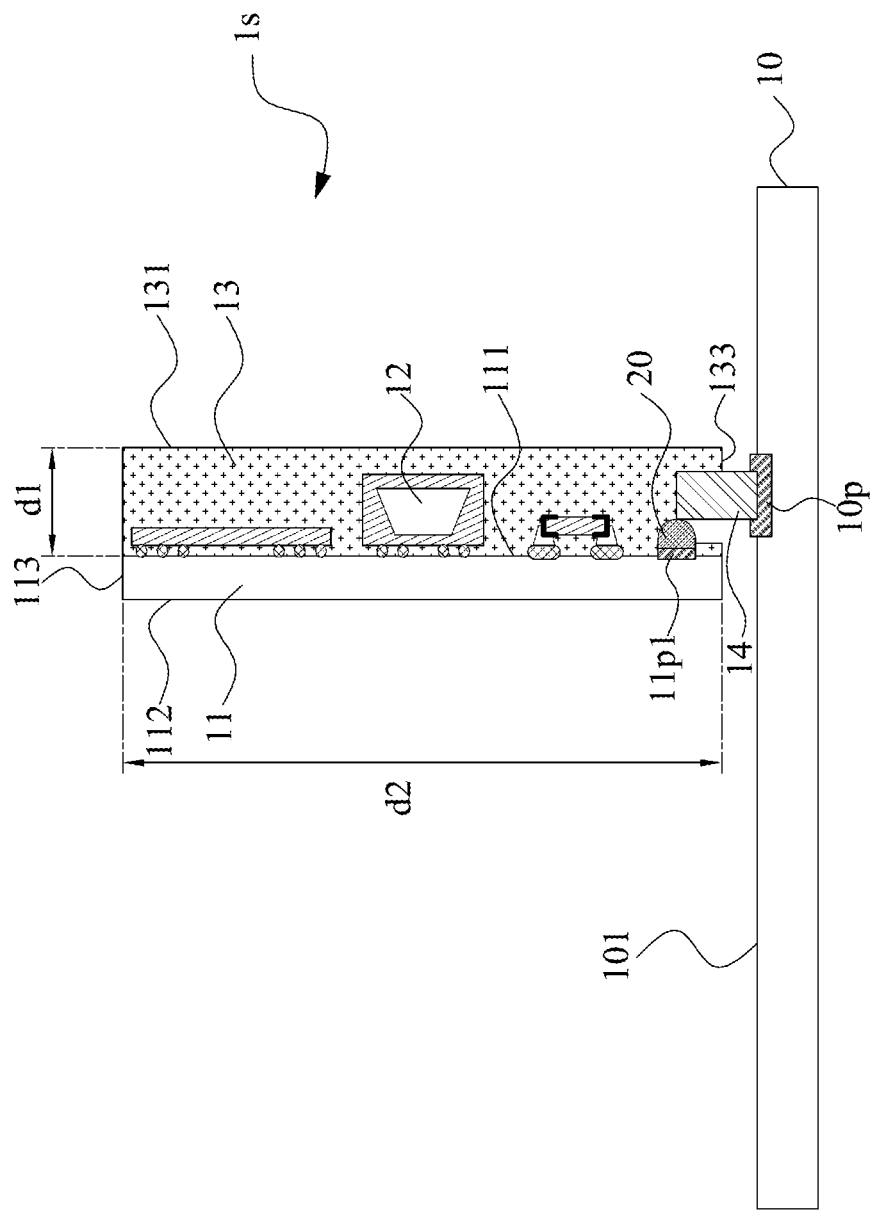
FIG. 2A illustrates a cross sectional view of an exemplary electronic assembly in accordance with some embodiments of the present disclosure.

FIG. 2A illustrates a cross sectional view of an exemplary electronic assembly 2 in accordance with some embodiments of the present disclosure. The electronic assembly 2 in FIG. 2A is similar to the electronic assembly 1 in FIG. 1A except for the differences described below.

The electronic assembly 2 may further include an electrical contact 20 covering the electrical contact 11p1. In some embodiments, the electrical contact 20 may be exposed from the encapsulant 13 through the cavity. In some embodiments, the electrical contact 20 may be in contact with the conductive element 14 to provide electrical interconnection or signal transmission between the substrate 10 and the semiconductor device package 1s.

In some embodiments, the electrical contact 20 may include a flowable conductive material. In some embodiments, the electrical contact 20 may include a soldering material. In some embodiments, the electrical contact 20 may include, for example, eutectic Sn/Pb, high-lead solder, lead-free solder, pure tin solder, or other types of solders.

In some embodiments, since the electrical contact 20 covers the electrical contact 11$p$1, the electrical contact 11$p$1 may be not exposed through the cavity of the encapsulant 13. In an operation to remove the encapsulant 13 to form the cavity, the electrical contact 20 may protect the solder mask on the substrate 11 from being removed or etched away. In some embodiments, the substrate 11 may be not exposed from the encapsulant 13 through the cavity.

Figure 2C:
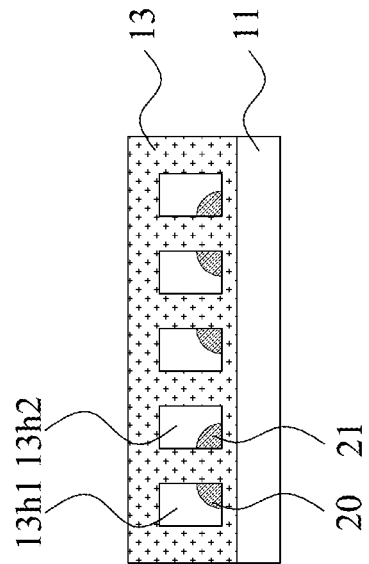
FIG. 2C illustrates a cross sectional view of an exemplary semiconductor device package in accordance with some embodiments of the present disclosure.
Figure 2B:
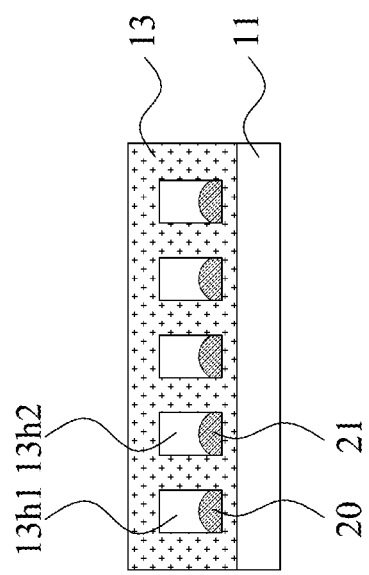
FIG. 2B illustrates a cross sectional view of an exemplary semiconductor device package in accordance with some embodiments of the present disclosure.

FIG. 2B illustrates a cross sectional view of a semiconductor device package in accordance with some embodiments of the present disclosure. FIG. 2B only illustrates a part of the substrate 11, a part of the encapsulant 13, and electrical contacts 20, 21. In some embodiments, the semiconductor device package 1$s$ in FIG. 2A may have a cross sectional view as shown in FIG. 2B.

The encapsulant 13 may have a plurality of cavities (including the cavity 13$h$1 and the cavity 13$h$2). The cavity 13$h$2 may be spaced apart from the cavity 13$h$1. The electrical contact 21 may be exposed from the encapsulant 13 through the cavity 13$h$2.

In some embodiments, with more electrical contacts to provide electrical interconnection or signal transmission between the substrate 10 and the semiconductor device package 1$s$, I/O numbers can be increased and electrical performance of the electronic assembly 1 can be improved.

In some other embodiments, the encapsulant 13 may have any number of cavities. In addition, there may be one or more electrical contacts exposed from each of the cavities.

FIG. 2C illustrates a cross sectional view of a semiconductor device package in accordance with some embodiments of the present disclosure. FIG. 2C only illustrates a part of the substrate 11, a part of the encapsulant 13, and electrical contacts 20, 21. In some embodiments, the semiconductor device package 1$s$ in FIG. 2A may have a cross sectional view as shown in FIG. 2C.

Similar to FIG. 2B, the encapsulant 13 may have a plurality of cavities (including the cavity 13$h$1 and the cavity 13$h$2) except that the electrical contacts may not be equally spaced. For example, the electrical contact 21 may be closer to the electrical contact 20 than to the other electrical contacts.

Figure 3:
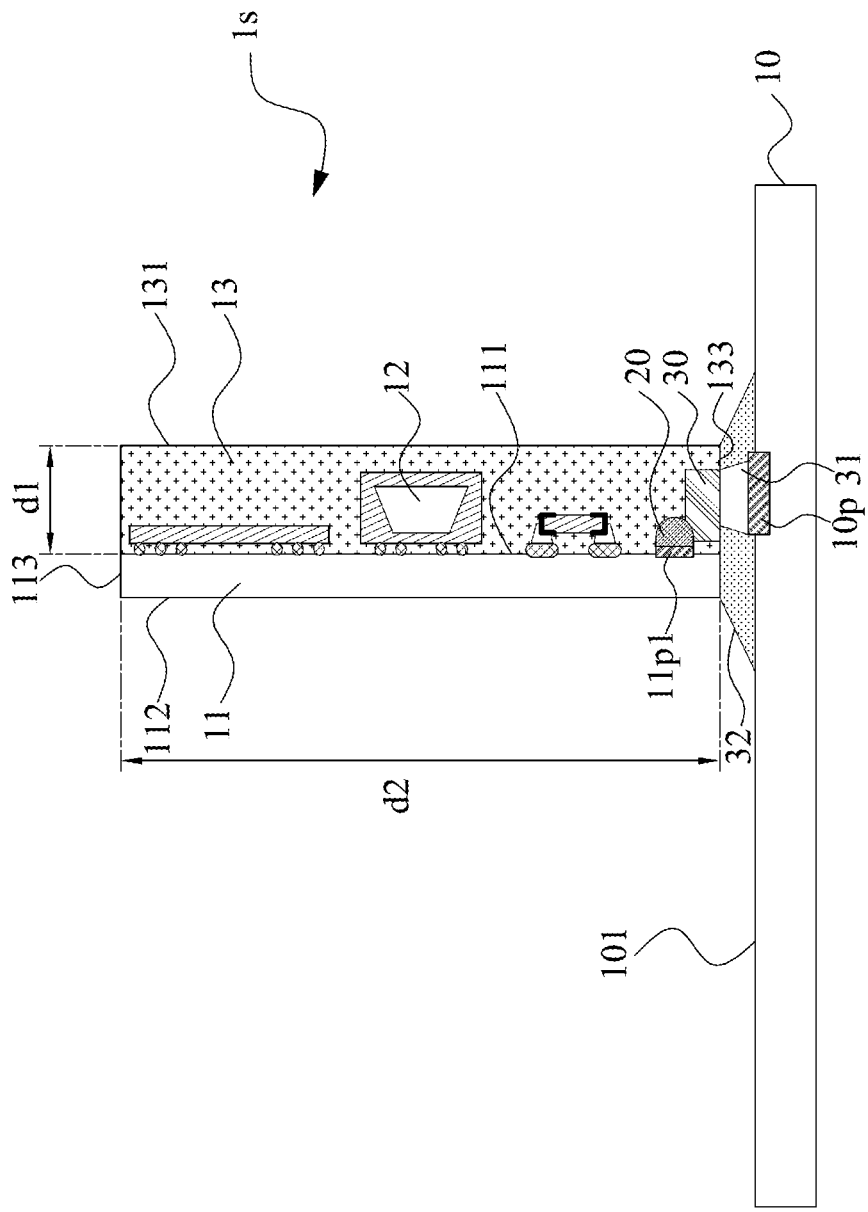
FIG. 3 illustrates a cross sectional view of an exemplary electronic assembly in accordance with some embodiments of the present disclosure.

FIG. 3 illustrates a cross sectional view of an exemplary electronic assembly 3 in accordance with some embodiments of the present disclosure. The electronic assembly 3 in FIG. 3 is similar to the electronic assembly 2 in FIG. 2A except that the conductive element 14 in the electronic assembly 2 is replaced with conductive materials 30, 31 and that the electronic assembly 2 further includes an underfill 32.

The conductive material 30 may be exposed from the surface 133 of the encapsulant 13. The conductive material 30 may be in contact with the electrical contact 20 on the electrical contact 11$p$1. In some embodiments, the conductive material 30 may be formed by filling the conductive material 30 in the cavity of the encapsulant 13.

In some embodiments, the conductive material 30 and the conductive material 31 may each have a material (as listed above) for the electrical contact 20. In some embodiments, the conductive material 30 may be well combined or have a standard wetting balance with the electrical contact 20.

In some embodiments, the underfill 32 may be formed to encapsulate the conductive material 31. In some embodiments, the underfill 32 includes an epoxy resin, a molding compound (e.g., an epoxy molding compound or other molding compound), a polyimide, a phenolic compound or material, a material including a silicone dispersed therein, or a combination thereof.

Figure 4A:
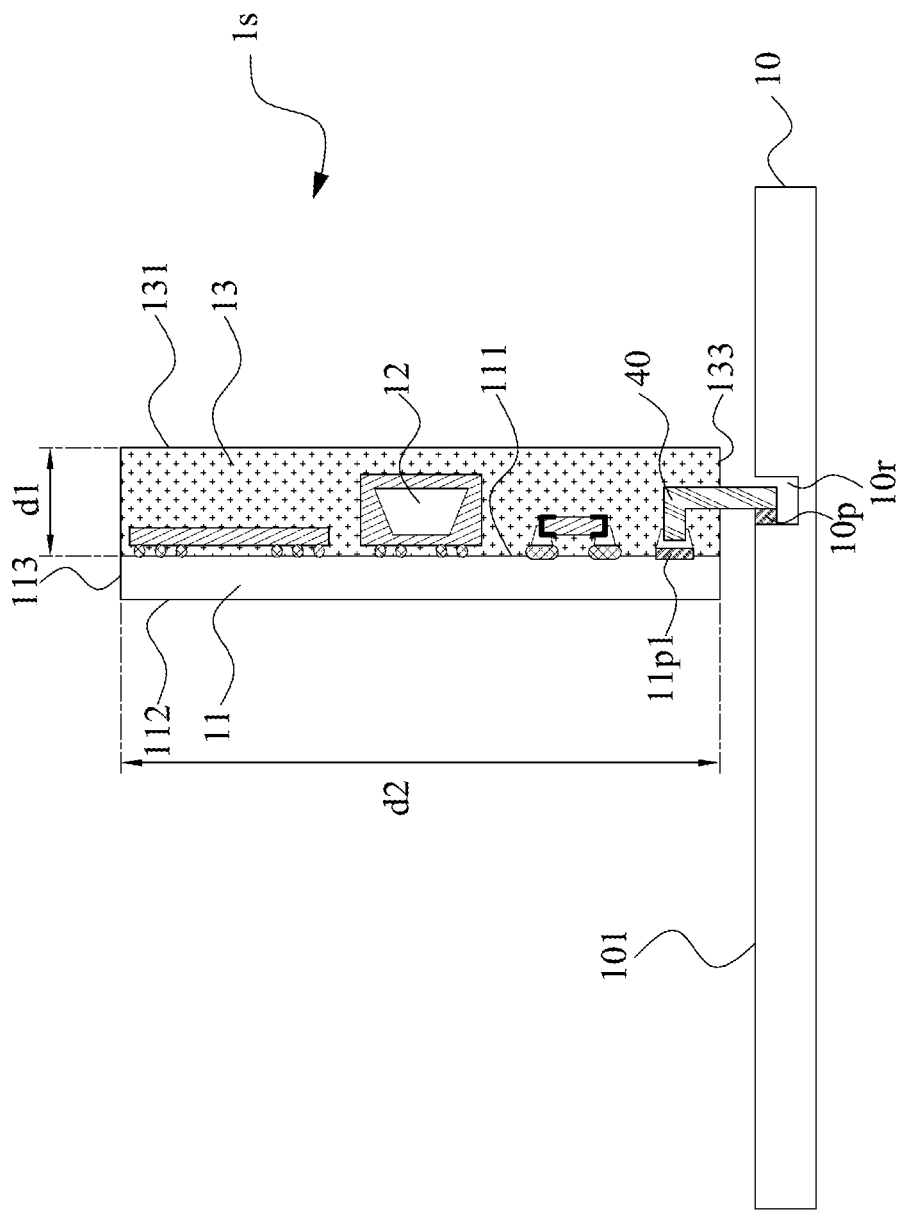
FIG. 4A illustrates a cross sectional view of an exemplary electronic assembly in accordance with some embodiments of the present disclosure.
Figure 4B:
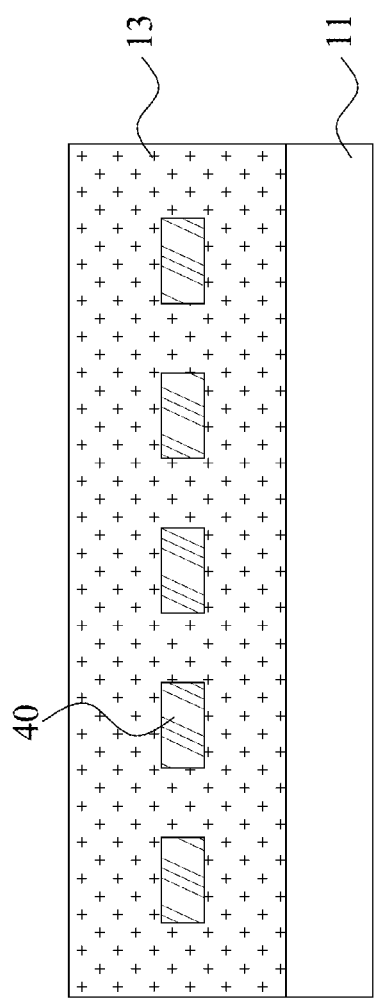
FIG. 4B illustrates a cross sectional view of an exemplary electronic assembly in accordance with some embodiments of the present disclosure.

FIG. 4A illustrates a cross sectional view of an exemplary electronic assembly 4 in accordance with some embodiments of the present disclosure. In some embodiments, the semiconductor device package 1$s$ in FIG. 4A may have a cross sectional view as shown in FIG. 4B. The electronic assembly 4 in FIG. 4A is similar to the electronic assembly 1 in FIG. 1A except that the conductive element 14 in the electronic assembly 1 is replaced with a conductive frame 40. In addition, the substrate 10 may have a cavity 10$r$ recessed from the surface 101. The conductive frame 40 may extend into the cavity 10$r$ of the substrate 10 and contact the conductive pad 10$p$. In some embodiments, as shown in the enlarged view, the conductive frame 40 may have a plurality of pins exposed from the encapsulant 13.

Figure 5A:
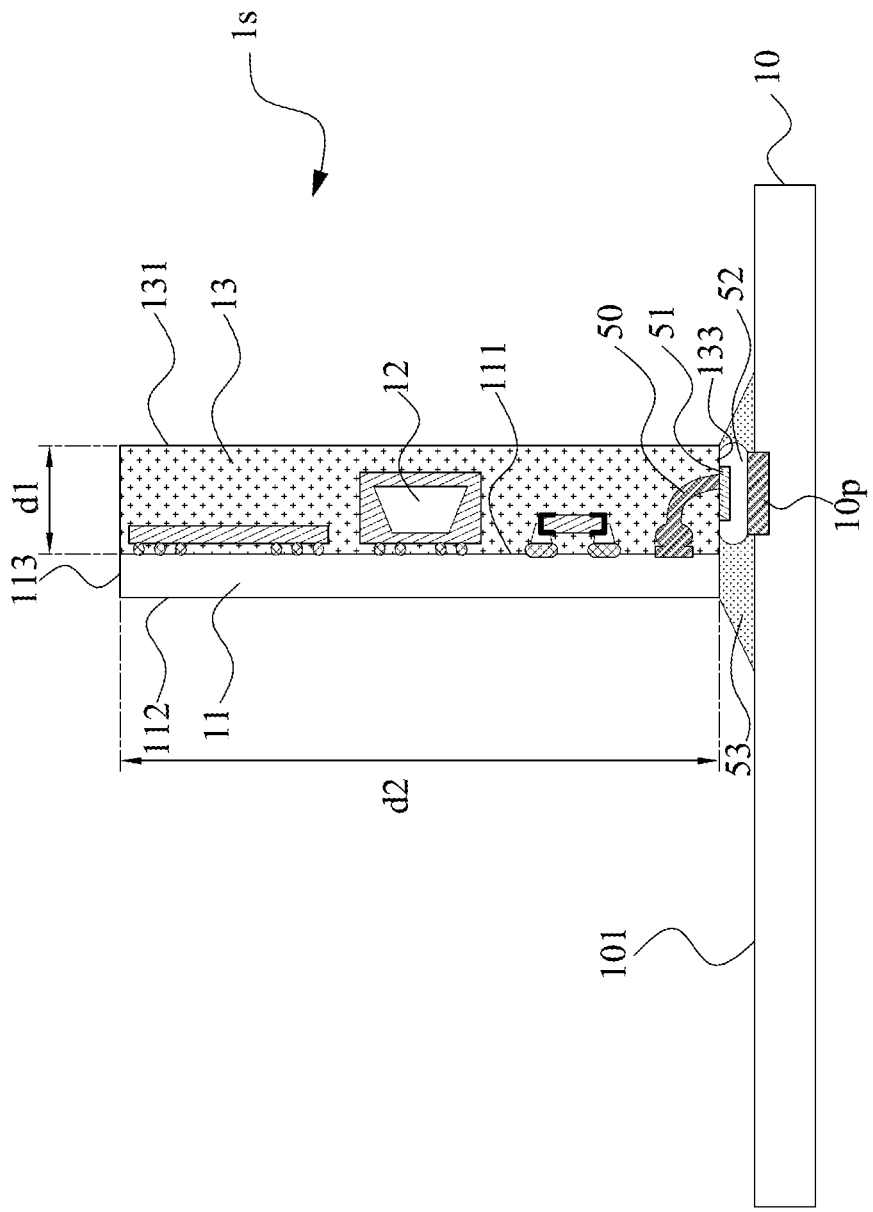
FIG. 5A illustrates a cross sectional view of an exemplary electronic assembly in accordance with some embodiments of the present disclosure.
Figure 5B:
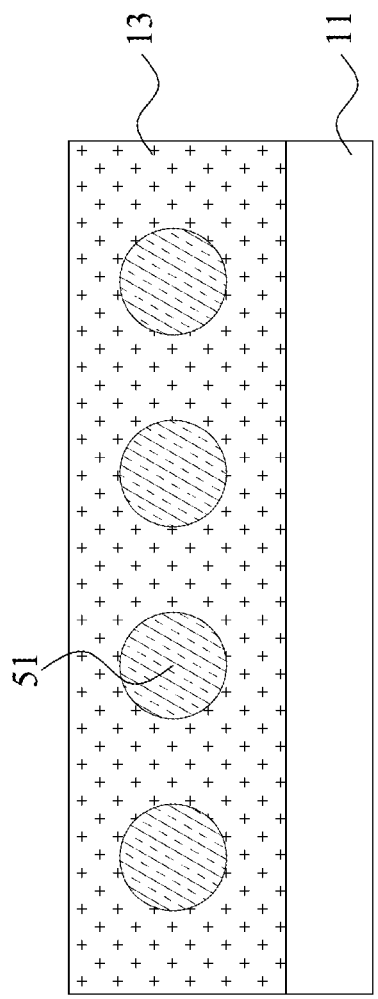
FIG. 5B illustrates a cross sectional view of an exemplary electronic assembly in accordance with some embodiments of the present disclosure.

FIG. 5A illustrates a cross sectional view of an exemplary electronic assembly 5 in accordance with some embodiments of the present disclosure. In some embodiments, the semiconductor device package 1$s$ in FIG. 5A may have a cross sectional view as shown in FIG. 5B. The electronic assembly 5 in FIG. 5 is similar to the electronic assembly 1 in FIG. 1A except that the conductive element 14 in the electronic assembly 1 is replaced with a conductive wire 50, a wire end pad 51, and a conductive material 52, and that the electronic assembly 5 further includes an underfill 53.

In some embodiments, the wire end pad 51 may be a conductive thin film. In some embodiments, as shown in the enlarged view, there may be a plurality of wire end pads 51 on the encapsulant 13.

In some embodiments, the conductive material 52 may have a material as listed above for the electrical contact 20.

In some embodiments, the underfill 53 may be formed to encapsulate the wire end pad 51 and the conductive material 52. In some embodiments, the underfill 53 may have a material as listed above for the underfill 32.

FIG. 6 illustrates a cross sectional view of an exemplary electronic assembly 6 in accordance with some embodiments of the present disclosure. The electronic assembly 6 in FIG. 6 is similar to the electronic assembly 1 in FIG. 1A except for the differences described below. The electronic assembly 6 may include a substrate 60 and a semiconductor device package 6$s$.

An electronic component 61 may be disposed on a surface 601 of the substrate 60. An encapsulant 62 (which may be referred to as a protection layer) may be disposed on the surface 601 of the substrate 60 to cover or encapsulate the electronic component 61. In some embodiments, the substrate 60, the electronic component 61, and the encapsulant 62 may be collectively referred to as a semiconductor device package or a package.

Figure 6A:
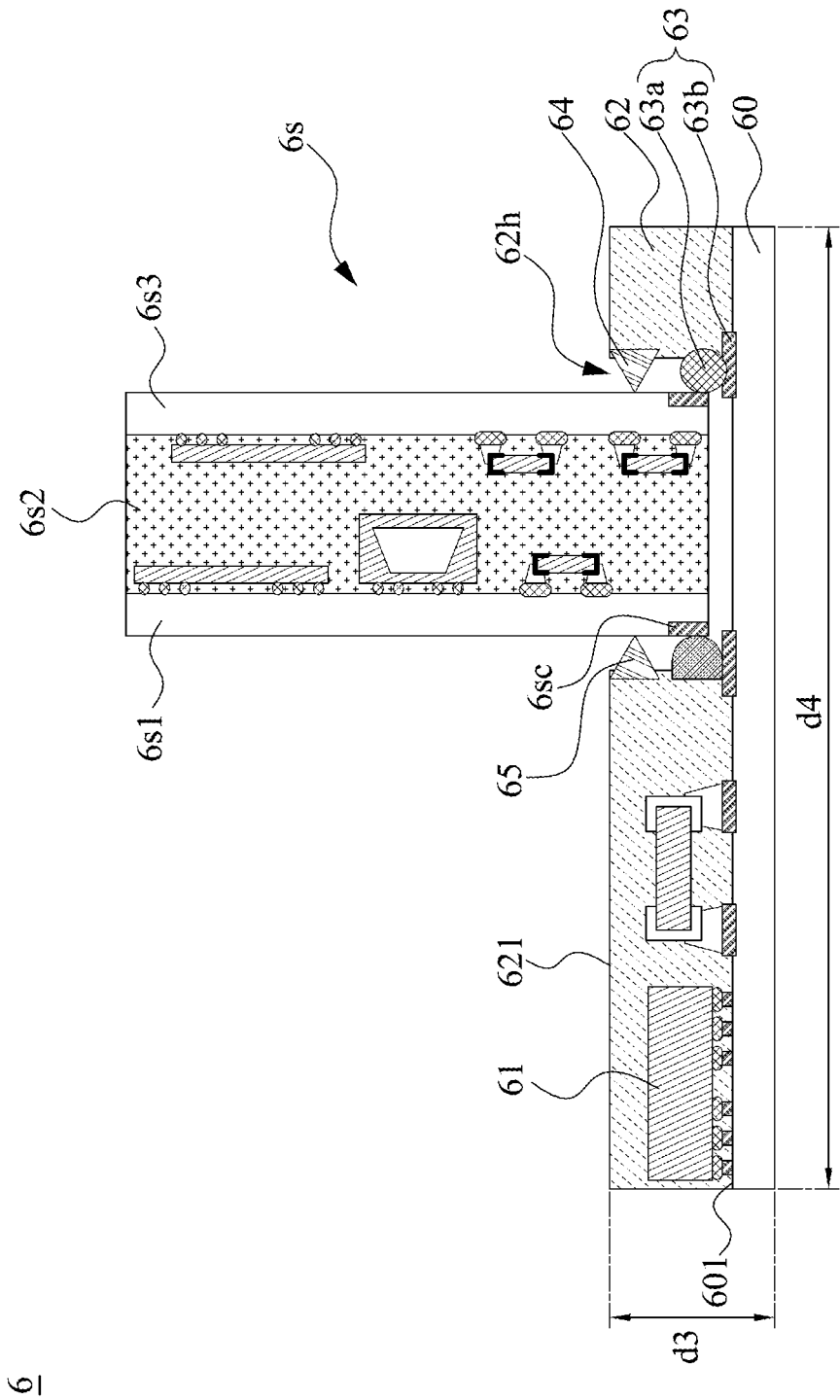
FIG. 6A illustrates a cross sectional view of an exemplary electronic assembly in accordance with some embodiments of the present disclosure.

The encapsulant 62 may have a surface 621 facing away from the substrate 60. The encapsulant 62 may have a dimension d3 (e.g., a thickness or a height) measured between the surface 601 of the substrate 60 and the surface 621 of the encapsulant 62. The encapsulant 13 may have a dimension d4 (e.g., a length or a width) measured between two edges of the encapsulant 62 from a side view as shown in FIG. 6A. In some embodiments, the dimension d4 may be greater than the dimension d3. In other words, the dimension d3 may be smaller than the dimension d4. The longer or greater side of the encapsulant 62 may face the semiconductor device package 6$s$.

The encapsulant 62 may define or have a cavity 62$h$ recessed from the surface 621. The cavity 62$h$ may be recessed from the longer or greater side (with the dimension d4) of the encapsulant 62. In some embodiments, the cavity 62h may penetrates through the encapsulant 62. For example, a part of the surface 601 of the substrate 60 may be exposed from the encapsulant 62 through the cavity 62h. For example, the cavity 62h may penetrates from the surface 621 to the surface 601.

In some embodiments, the cavity 62h may be inclined to a periphery of the encapsulant 62. For example, the cavity 62h may be closer to a side of the encapsulant 62 than the opposite side of the encapsulant 62. For example, the cavity 62h may be spaced apart from a central portion of the encapsulant 62. For example, the cavity 62h may be spaced apart from a central line of the encapsulant 62. In some embodiments, the cavity 62h may be spaced apart from the circuit area of the substrate 60. For example, the circuit area of the substrate 60 is not exposed from the encapsulant 62.

The substrate 60 may include, for example, one or more electrical contacts 63 proximate to, adjacent to, or embedded in and exposed from the surface 601 of the substrate 60. In some embodiments, as shown in FIG. 6A, the electrical contact 63 may include a soldering material 63a on a conductive pad 63b. In some embodiments, the electrical contact 63 may include other types of connecting elements described above (such as the electrical contact 11p1, the conductive element 14, the conductive material 30, the conductive frame 40, the conductive wire 50, etc.). In some embodiments, the electrical contact 63 may be exposed from the encapsulant 62 through the cavity 62h. For example, the electrical contact 63 may be partially exposed from the encapsulant 62 through the cavity 62h.

Elastic elements 64 and 65 may be provided on a sidewall of the cavity 62h. In some embodiments, a flexibility of the elastic element 64 may be greater than a flexibility of the encapsulant 62. In some embodiments, a flexibility of the elastic element 64 may be greater than a flexibility of the electrical contact 63. In some embodiments, a distance between the elastic element 64 and the surface 601 may be greater than a distance between the electrical contact 63 and the surface 601. For example, in the normal direction of the surface 601, the electrical contact 63 is located between the surface 601 and the elastic element 64.

The semiconductor device package 6s (which may be abbreviated as a package) may be accommodated in (such as partially accommodated in) the cavity 62h. The package 6s may include substrates 6s1 and 6s3, and a molding material 6s2 (or an encapsulant) disposed between the substrates 6s1 and 6s3. In some embodiments, the package 6s may include one or more electronic components on the substrate 6s1 and/or the substrate 6s3. The one or more electronic components may disposed between the substrates 6s1 and 6s3. The one or more electronic components may be covered or encapsulated by the molding material 6s2 (or an encapsulant). In some embodiments, the package 6s may include one substrate and a molding material (or an encapsulant) disposed on the substrate. In some embodiments, the package 6s may be or may include a conductive element. The package 6s may include, for example, one or more conductive pads 6sc proximate to, adjacent to, or embedded in and exposed from the substrate 6s1 and/or the substrate 6s3.

In some embodiments, the package 6s may have a portion physically connecting to the electrical contact 63. For example, the package 6s may have a portion directly contacting the electrical contact 63. In some embodiments, the conductive pad 6sc may have a portion physically connecting to the electrical contact 63. For example, the conductive pad 6sc may have a portion directly contacting the electrical contact 63.

In some embodiments, the package 6s may have a portion physically disconnected from the electrical contact 63. For example, the package 6s may have a portion spaced apart from the electrical contact 63. In some embodiments, the conductive pad 6sc may have a portion physically disconnected from the electrical contact 63. For example, the conductive pad 6sc may have a portion spaced apart from the electrical contact 63.

The package 6s may be pluggable with respect to the cavity 62h of the encapsulant 62 through the encapsulant 62. The package 6s may be supported by the encapsulant 62. For example, the package 6s may be directly supported by the encapsulant 62. For example, the package 6s may be indirectly supported by the encapsulant 62, such as through the elastic element 64 and the electrical contact 63. The package 6s may be surrounded by (such as partially accommodated by) the encapsulant 61. The package 6s may be mounted in the cavity 62h. The electrical contact 63 and the conductive pad 6sc may provide electrical interconnection or signal transmission between the substrate 60 and the package 6s.

The package 6s may be supported by the elastic element 64 and the electrical contact 63. In some embodiments, the elastic element 64 and the electrical contact 63 may functioned as location-limiting elements for the package 6s. For example, the elastic element 64 and the electrical contact 63 may fix the package 6s. For example, the elastic element 64 and the electrical contact 63 may press against the package 6s.

In some embodiments, the elastic element 64 may be a non-conductive location-limiting element. In some embodiments, the elastic element 64 may correspond to a non-conductive area (or a non-circuitry area) of the package 6s. In some embodiments, the elastic element 64 may be physically connected with a non-conductive area (or a non-circuitry area) of the package 6s. In some embodiments, the electrical contact 63 may be a conductive location-limiting element. In some embodiments, the electrical contact 63 may correspond to a conductive area (or a circuitry area) of the package 6s. In some embodiments, the electrical contact 63 may be physically connected with a conductive area (or a circuitry area) of the package 6s.

Figure 6B:
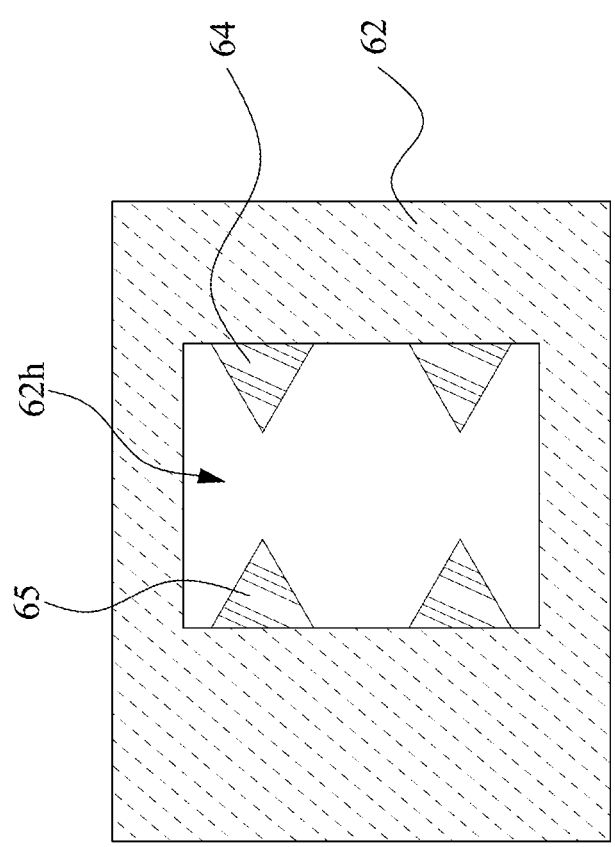
FIG. 6B illustrates a top view of a part of an exemplary electronic assembly in accordance with some embodiments of the present disclosure.

FIG. 6B illustrates a top view of a semiconductor device package in accordance with some embodiments of the present disclosure. FIG. 6B only illustrates a part of the encapsulant 62 and the elastic elements 64, 65. In some embodiments, the electronic assembly 6 in FIG. 6A may have a top view as shown in FIG. 6B.

The elastic elements 64 and 65 may have a triangular shape. In some other embodiments, the elastic elements can have any shape. In some other embodiments, at least two elastic elements 64 and 65 are provided on the opposite sidewalls of the cavity 62h to prevent the semiconductor device package 6s from shifting or rotating. In some other embodiments, the elastic elements 64 and 65 may be provided symmetrically. In some other embodiments, the elastic elements 64 and 65 may face each other. In some other embodiments, there may be any number of elastic elements provided on a sidewall of the cavity 62h.

Figure 7:
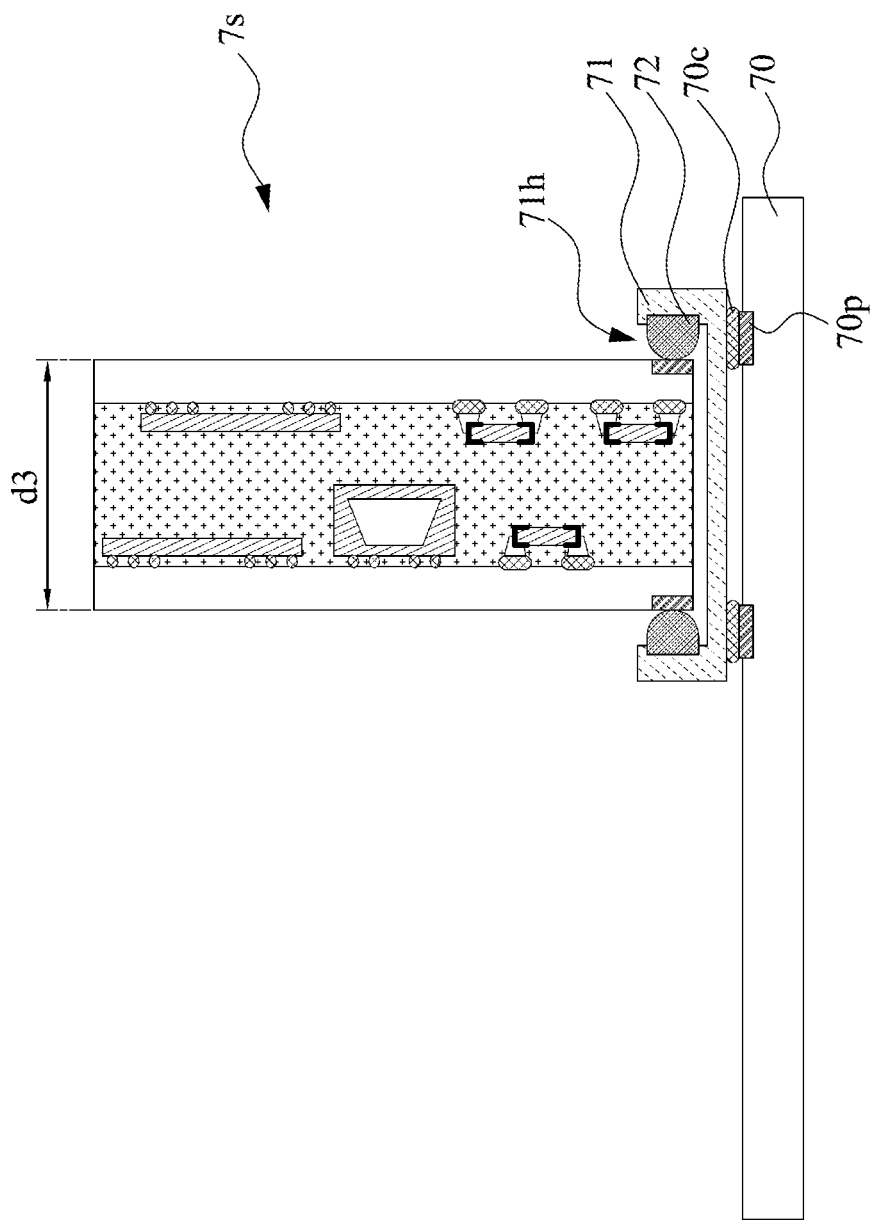
FIG. 7 illustrates a cross sectional view of an exemplary electronic assembly in accordance with some embodiments of the present disclosure.

FIG. 7 illustrates a cross sectional view of an exemplary electronic assembly 7 in accordance with some embodiments of the present disclosure. The electronic assembly 7 in FIG. 7 is similar to the electronic assembly 1 in FIG. 1A except for the differences described below. The electronic assembly 7 may include a substrate 70, and a semiconductor device package 7s.

The substrate 70 may include, for example, one or more conductive pads 70p proximate to, adjacent to, or embedded in and exposed from a surface of the substrate 70 facing the semiconductor device package 7s. A socket 71 may be provided on the substrate 70 and connected to the conductive pad 70p. The socket 71 may have a cavity 71h. In some embodiments, the electrical contact 72 may be provided on a sidewall of the cavity 71h.

The semiconductor device package 7s may be accommodated in (such as partially accommodated in) the cavity 71h. The socket 71 and the electrical contact 72 may provide electrical interconnection or signal transmission between the substrate 70 and the semiconductor device package 7s.

FIG. 8A, FIG. 8B, FIG. 8C, FIG. 8D, and FIG. 8E illustrate one or more stages of a method of manufacturing an exemplary semiconductor device package in accordance with some embodiments of the present disclosure. At least some of these figures have been simplified for a better understanding of the aspects of the present disclosure.

Referring to FIG. 8A, a substrate 11 having an electrical contact 11p1 on a surface 101 of the substrate 11 may be provided.

Referring to FIG. 8B, a protection layer 80 may be formed on the surface 101 of the substrate 11 to cover the electrical contact 11p1. In some embodiments, the protection layer 80 may include an adhesive such as a hot melt adhesive (HMA). In some embodiments, the protection layer 80 may include Ethylene-vinyl acetate (EVA), polyolefins (PO), polypropylene (PP), polyamides (PA), other feasible materials or two or more combinations thereof. In some embodiments, the protection layer 80 may be formed by using paste printing, compression molding, transfer molding selective molding, liquid glue molding, vacuum lamination, spin coating, or other suitable operations.

Referring to FIG. 8C, an encapsulant 13 may be formed on the surface 101 of the substrate 11 to cover the protection layer 80. In some embodiments, the encapsulant 13 may formed by using paste printing, compression molding, transfer molding selective molding, liquid glue molding, vacuum lamination, spin coating, or other suitable operations.

Figure 8E:
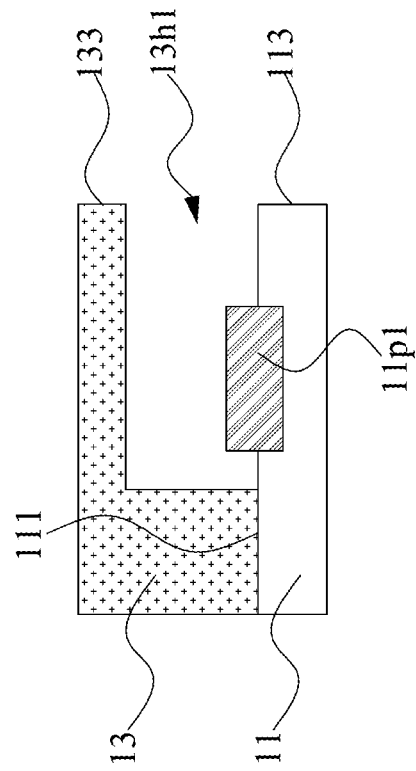
Figure 8D:
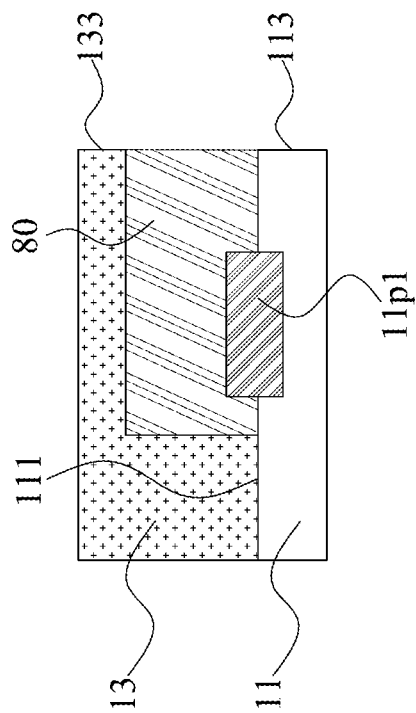

Referring to FIG. 8D, a singulation may be performed through the encapsulant 13 and the substrate 11. The singulation may be performed, for example, by using a dicing saw, laser, or other appropriate cutting techniques. After the singulation, a part of the protection layer 80 may be exposed. The exposed protection layer 80 may be substantially coplanar with the surface 133 of the encapsulant 13 and the surface 113 of the substrate 11.

Referring to FIG. 8E, the protection layer 80 may be removed to form the cavity 13h1 in the encapsulant 13.

The structure manufactured through the operations illustrated in FIG. 8A, FIG. 8B, FIG. 8C, FIG. 8D, and FIG. 8E may be similar to the semiconductor device package is in FIG. 1A and FIG. 1B.

FIG. 9A, FIG. 9B, FIG. 9C, and FIG. 9D illustrate one or more stages of a method of manufacturing an exemplary semiconductor device package in accordance with some embodiments of the present disclosure. At least some of these figures have been simplified for a better understanding of the aspects of the present disclosure.

Figure 9B:
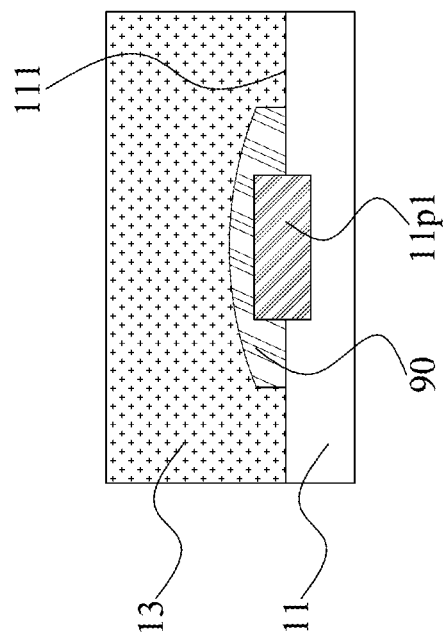
FIG. 9A, FIG. 9B, FIG. 9C, and FIG. 9D illustrate one or more stages of a method of manufacturing an exemplary semiconductor device package in accordance with some embodiments of the present disclosure.
Figure 9A:
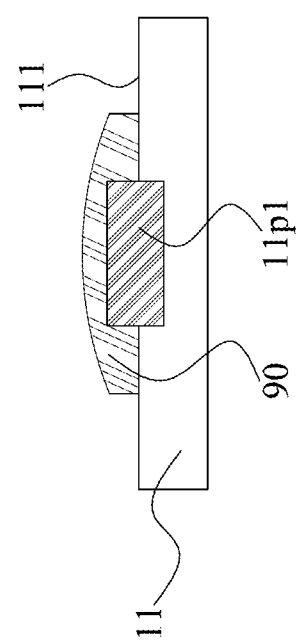

Referring to FIG. 9A, a substrate 11 having an electrical contact 11p1 on a surface 101 of the substrate 11 may be provided. A protection layer 90 may be formed on the surface 101 of the substrate 11 to cover the electrical contact 11p1. The protection layer 90 may be thinner than the protection layer 80 in FIG. 8B. The protection layer 90 may have an irregular shape.

Referring to FIG. 9B, an encapsulant 13 may be formed on the surface 101 of the substrate 11 to cover the protection layer 90. Optionally, a singulation may be performed through the encapsulant 13 and the substrate 11. After the singulation, the electrical contact 11p1 may be closer to the edge of the encapsulant 13.

Figure 9C:
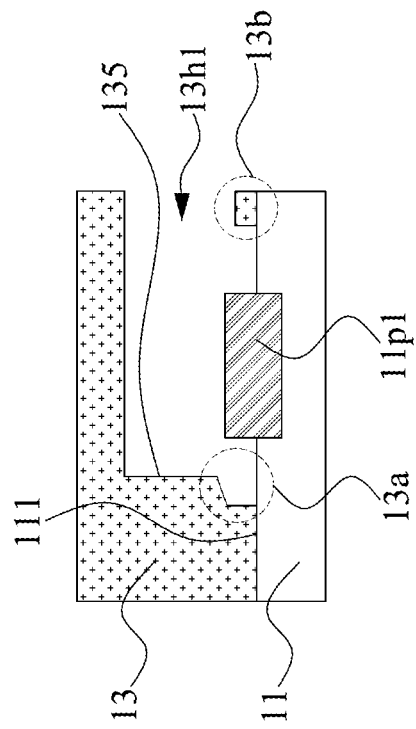

Referring to FIG. 9C, a cavity 13h1 may be formed by performing laser drilling. Then, a part of the protection layer 90 may be exposed. In some embodiments, residue of the encapsulant 13 as illustrated in the dotted circle 13b may remain on the substrate 11.

Figure 9D:
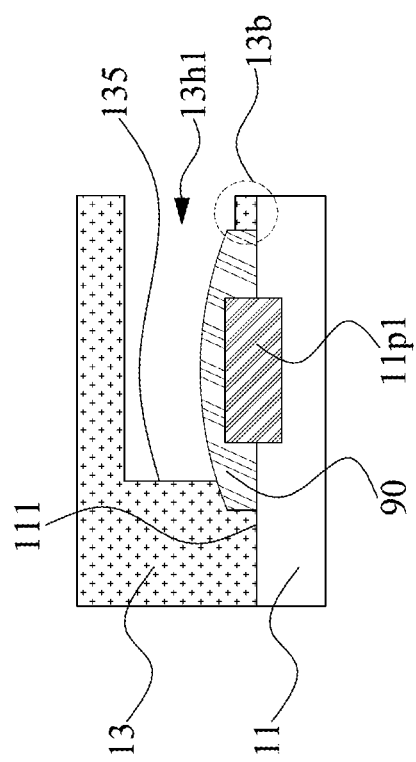

Referring to FIG. 9D, the protection layer 90 may be removed to expose the electrical contact 11p1 in cavity 13h1. In some embodiments, since the protection layer 90 is removed after the laser drilling in FIG. 9C to form the cavity 13h1, the bottom surface 135 of the encapsulant 13 may be non-planar. The bottom surface 135 of the encapsulant 13 may have a hole as illustrated in the dotted circle 13a.

The structure manufactured through the operations illustrated in FIG. 9A, FIG. 9B, FIG. 9C, and FIG. 9D may be similar to the structure in FIG. 1D.

FIG. 10A, FIG. 10B, FIG. 10C, FIG. 10D, FIG. 10E, and FIG. 10F illustrate one or more stages of a method of manufacturing an exemplary semiconductor device package in accordance with some embodiments of the present disclosure. At least some of these figures have been simplified for a better understanding of the aspects of the present disclosure.

Referring to FIG. 10A, a substrate 11 having an electrical contact 11p1 on a surface 101 of the substrate 11 may be provided.

Referring to FIG. 10B, a conductive wire 50 may be formed on the electrical contact 11p1 through a wire bonding operation.

Referring to FIG. 10C, an encapsulant 13 may be formed on the surface 101 of the substrate 11 to cover the conductive wire 50.

Referring to FIG. 10D, a singulation may be performed through the encapsulant 13 and the substrate 11. After the singulation operation, a part of the conductive wire 50 may be exposed from the encapsulant 13. The exposed part of the conductive wire 50 may be substantially coplanar with the surface 133 of the encapsulant 13 and the surface 113 of the substrate 11.

Referring to FIG. 10E, a conductive layer 51' may be disposed on an external surface of the encapsulant 13. The conductive layer 51' may cover the exposed part of the conductive wire 50. In some embodiments, the conductive layer 51' may be a conductive thin film. The conductive layer 51' may be formed by, for example, a plating process.

Referring to FIG. 10F, the conductive layer 51' may be patterned to form a wire end pad 51.

The structure manufactured through the operations illustrated in FIG. 10A, FIG. 10B, FIG. 10C, FIG. 10D, FIG. 10E, and FIG. 10F may be similar to the semiconductor device package in FIG. 5.

Spatially relative terms, such as "beneath," "below," "lower," "above," "upper," "left," "right" and the like, may be used herein for ease of description to describe one element or feature's relationship to another element(s) or feature(s) as illustrated in the figures. The spatially relative terms are intended to encompass different orientations of the device in use or operation, in addition to the orientation depicted in the figures. The apparatus may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

As used herein, the terms "approximately", "substantially", "substantial" and "about" are used to describe and account for small variations. When used in conduction with an event or circumstance, the terms can refer to instances in which the event or circumstance occurs precisely as well as instances in which the event or circumstance occurs to a close approximation. As used herein with respect to a given value or range, the term "about" generally means within ±10%, ±5%, ±1%, or ±0.5% of the given value or range. Ranges can be expressed herein as from one endpoint to another endpoint or between two endpoints. All ranges disclosed herein are inclusive of the endpoints unless specified otherwise. The term "substantially coplanar" can refer to two surfaces within micrometers (μm) of lying along the same plane, such as within 10 μm, within 5 μm, within 1 μm, or within 0.5 μm of lying along the same plane. When referring to numerical values or characteristics as "substantially" the same, the term can refer to the values lying within ±10%, ±5%, ±1%, or ±0.5% of an average of the values.

The foregoing outlines features of several embodiments and detailed aspects of the present disclosure. The embodiments described in the present disclosure may be readily used as a basis for designing or modifying other processes and structures for carrying out the same or similar purposes and/or achieving the same or similar advantages of the embodiments introduced herein. Such equivalent constructions do not depart from the spirit and scope of the present disclosure, and various changes, substitutions, and alterations may be made without departing from the spirit and scope of the present disclosure.

What is claimed is:

1. An electronic assembly, comprising:
   a package including an electronic component and a protection layer covering the electronic component; and
   a conductive element supported by the protection layer and electrically connected with the electronic component through an electrical contact,
   wherein the protection layer has a first surface with a first dimension and a second surface with a second dimension longer than the first dimension, and a cavity is recessed from the first surface of the protection layer.

2. The electronic assembly of claim 1, wherein the conductive element has a first portion physically connecting to the electrical contact and a second portion physically disconnected from the electrical contact.

3. The electronic assembly of claim 1, wherein the package includes a substrate on which the electronic component is disposed and the cavity is spaced apart from a top surface of the protection layer facing away from the substrate.

4. The electronic assembly of claim 1, wherein the package includes a substrate on which the electronic component is disposed and an edge of the protection layer has a surface substantially coplanar with a lateral surface of the substrate.

5. The electronic assembly of claim 1, wherein the protection layer defines a plurality of cavities including the cavity and separated from each other, and the electronic assembly includes a plurality of conductive elements including the conductive element, wherein each of the plurality of conductive elements is accommodated in one of the plurality of cavities.

6. An electronic assembly, comprising:
   a first package including an electronic component and a protection layer covering the electronic component, wherein the protection layer has a cavity recessed from the protection layer;
   a conductive element supported by the protection layer and electrically connected with the electronic component through an electrical contact; and
   a first location-limiting element within the cavity configured to fix the conductive element, wherein the first location-limiting element is physically connected to a non-circuitry area of the conductive element.

7. The electronic assembly of claim 6, wherein the protection layer has a first surface with a first dimension and a second surface with a second dimension longer than the first dimension, and wherein the cavity is recessed from the second surface of the protection layer.

8. The electronic assembly of claim 6, wherein a flexibility of the first location-limiting element is greater than a flexibility of the protection layer.

9. The electronic assembly of claim 6, further comprising:
   a second location-limiting element, wherein the first location-limiting element and the second location-limiting element are disposed on the protection layer and facing each other.

10. The electronic assembly of claim 6, wherein the cavity is inclined to a periphery of the protection layer.

11. The electronic assembly of claim 6, wherein the cavity penetrates through the protection layer.

12. The electronic assembly of claim 6, further comprising:
    a second package mounted in the cavity, wherein the second package has a first substrate and the conductive element is disposed on the first substrate.

13. The electronic assembly of claim 12, wherein the second package further comprises a second substrate, and a molding material disposed between the first substrate and the second substrate.

14. An electronic assembly, comprising:
    a first package including a first electronic component and a first protection layer covering the first electronic component, the first protection layer defining a cavity penetrating the first protection layer;
    a second package pluggable with respect to the cavity of the first package through the first protection layer; and
    a location-limiting element configured to fix the second package.

15. The electronic assembly of claim 14, wherein the location-limiting element has a conductive portion and a non-conductive portion, wherein the conductive portion corresponds to a conductive area of the second package and the non-conductive portion corresponds to a non-conductive area of the second package.

16. The electronic assembly of claim 15, wherein a flexibility of the non-conductive portion is greater than a flexibility of the conductive portion.

17. The electronic assembly of claim 14, wherein the second package includes a second electronic component and a second protection layer covering the second electronic component.

18. The electronic assembly of claim 15, wherein the non-conductive portion protrudes from an internal surface of the cavity so that a gap exists between the first package and the second package.

\* \* \* \* \*